United States Patent Office 3,092,494

Patented June 4, 1963

3,092,494

LIGHT SENSITIVE AZIDES, PRINTING PLATES COMPRISING SUCH COMPOUNDS AND PROCESS FOR THE PRODUCTION THEREOF

Oskar Süs, Wiesbaden-Biebrich, Germany, and Werner Schaefer, Basel, Switzerland, assignors, by mesne assignments, to Azoplate Corporation, Murray Hill, N.J.

No Drawing. Filed May 19, 1954, Ser. No. 430,978
Claims priority, application Germany May 28, 1953
4 Claims. (Cl. 96—33)

This invention is concerned with improvements in or relating to processes for the photo-mechanical production of flat printing plates and light-sensitive material therefor.

It has been suggested to use certain aryl azides (also known as aromatic azido compounds) as light-sensitive substances for the production of a light-sensitive layer. If the parts of such a layer which have been unaffected by light after exposure to a light image are removed stable images are obtained, which are colored in with the light-decomposition products of the aryl azides still present. In producing light-sensitive layers for this purpose containing aromatic azide compounds, it has been suggested to employ colloids which can be hardened in light. As far as the production of planographic printing plates is concerned, particularly for offset flat printing by a photo-mechanical process, the known aryl azides are only suitable if hardenable colloid layers are made light-sensitive with them.

Such a process is very troublesome, however, and has been superseded by methods in which the greasy printing ink adheres to some parts of the originally light-sensitive substance itself, either by the light-sensitive substance itself forming the printing image, or by the image being formed of the light-decomposition products of the light-sensitive substance resulting from the exposure. Those aryl azides previously suggested have proved to be incapable of being suitable in such a process.

It is therefore one object of this invention to enable the employment of aryl azides as the light-sensitive substance in the production of printing plates. It is a further object of this invention to employ certain aryl azides without hardenable colloid layers for forming printing images. A still further object is the obtention of certain new groups of aryl azides.

The present invention provides a process for the photo-mechanical production of planographic printing plates, especially suitable for offset printing, wherein the light-sensitive material consists of a base and a light-sensitive layer, and the light-sensitive layer consists essentially of aromatic azido compounds. Preferably such aromatic azido compounds are substituted in the nucleus containing the azido group either by a sulpho group amidated with a primary aromatic amine or by a primary amino group substituted with the sulphonyl residue of an aromatic sulpho acid. This material is then exposed under a master, treated with a dilute alkaline solution and further treated with dilute acids. Preferably the base comprises aluminum foil and the dilute acid is phosphoric acid. If desired, alkali-soluble non-hardenable resins may be included in the light-sensitive layer.

Of particular significance to the present invention are compounds falling within one or more of the following general formulae:

(I)

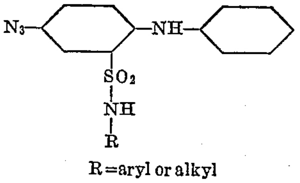

R=aryl or alkyl (II)

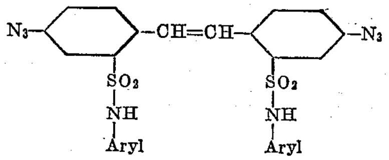

(III)

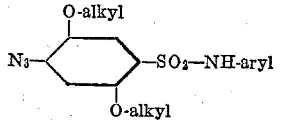

(IV)

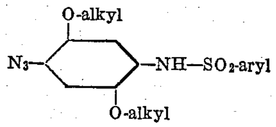

(V)

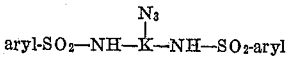

wherein K=a naphthylene, phenylene or diphenylene nucleus.

(VI)

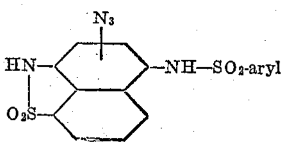

(VII) $N_3$—K—NH—$SO_2$-aryl wherein K=a naphthylene, phenylene or diphenylene nucleus.

(VIII) $N_3$—K—$SO_2$—NH-aryl wherein K=a naphthylene, phenylene or diphenylene nucleus.

As used in the above formulae and as used hereinafter the terms "aryl" or "alkyl" are understood to include both substituted as well as unsubstituted aryl or alkyl, respectively, and may bear one or several substituents as may be seen from the numerous compounds enumerated in the description and the examples.

The printing plates produced in accordance with this invention are usable with advantage in flat printing and also in offset flat printing, after inking with greasy ink in the usual manner, either manually or mechanically. Since the light-sensitive material from which they are produced has a simple composition and is simple to prepare, and since the transformation of the light-sensitive material into a printing plate requires a few steps only and presents no difficulties, the process represents a considerable advance in the art.

The aromatic azido compounds which are, according to the invention, to be used as light-sensitive substances, are insoluble in water but soluble in organic solvents. They may be applied by whirlcoating, brushing or spraying of the solutions on suitable bases, preferably metals such as aluminum or zinc. After evaporation of the solvent, the light-sensitive substance remains behind as a thin and even film on the base.

Images are produced in the light-sensitive layers by exposure, under a transparent master, to one of the light sources normally used in the art, which appear in the colors customary to the light-decomposition products, i.e. mainly brownish yellow to violet-red tones. As the exposure continues the color increases in intensity, so that it is possible to watch the progress of the light-decomposition. An advantage of the invention lies in the production of colored images as contrasted with known methods in which the image does not appear after exposure, but only occurs after development or has to be made visible by the addition of auxiliary materials, e.g. organic dyes.

The production of printing plates requires, in addition, the treatment of the exposed layer with dilute alkaline solutions. This treatment removes from the foil either the light-decomposition products of the aromatic azido compound in those areas affected by light during exposure under the master, or, the parts of the layer which have remained unaffected during exposure. This treatment, also described as development of the printing image, is necessary because both the azido compounds to be used and its light-decomposition products are oleophilic and retain greasy ink when brought into contact with it.

The difference which exists between the azido compounds to be used according to this invention, and their light-decomposition products, in their solubility in dilute alkaline solutions, can be influenced by substituents. For example, the addition of alkoxy groups in the aromatic residue containing the azido group increases the solubility of the light-decomposition products in dilute alkalies in comparison with the solubility of the unchanged azide. On developing images, produced with azides substituted in this manner, the unchanged azide remains on the surface of the base, while the light-decomposition product is removed. A positive image is obtained from a positive original.

The azido compounds to be used in the light-sensitive layer according to the invention can be employed alone, or, admixed with each other, particularly when they show a tendency towards crystallization. Other substances inhibiting or retarding crystallization may be added to the azido compound solutions, as, for example, alkali-soluble resins, as formaldehyde-phenol-resin, shellac or colophony. Such additions have a favorable effect insofar as they facilitate the application of a thin film on the surface of the carrier.

The compounds claimed according to the invention may be obtained from chlorides of nitrosulfonic acids by reaction with bases, reduction of the nitro group to the amino group and conversion of the resulting amine into the azide by formation of the diazo compound. It is also possible to use as the starting material sulphonic acids which already have an azido group formed in the molecule. They are converted by known means to the sulphochlorides, and the latter are reacted with bases.

Compounds which contain the azide group in a nucleus having a primary amino group substituted by an aromatic sulfonyl residue can be produced from aromatic nitroamines which by reaction with sulpho-chlorides are sulphonated in the amino groups. The nitro group is converted into the azide group, as described above.

The light-sensitive material, which consists of a suitable base layer and a light-sensitive substance formed from aromatic azido compounds according to the invention has been found to have a notably long shelf life.

The following compounds are hereinafter referred to in the examples:

(1)

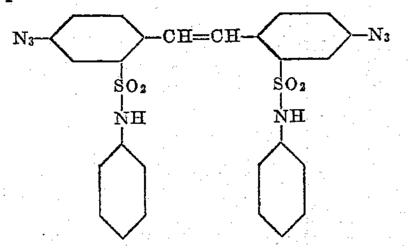

(2)

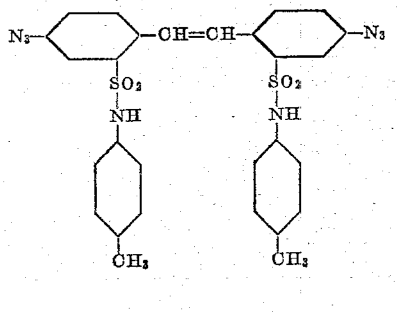

(3)

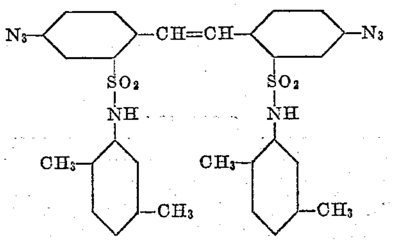

(4)

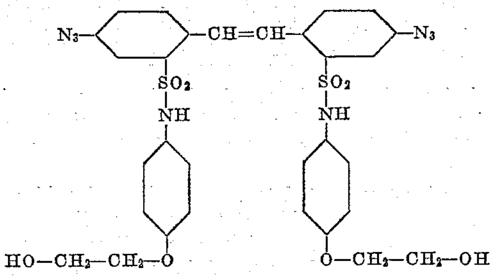

(5)

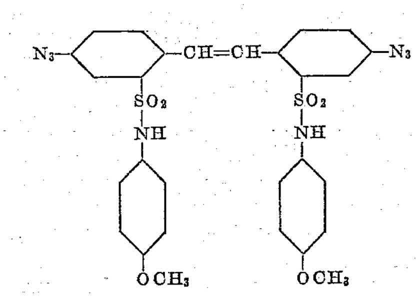

(6)

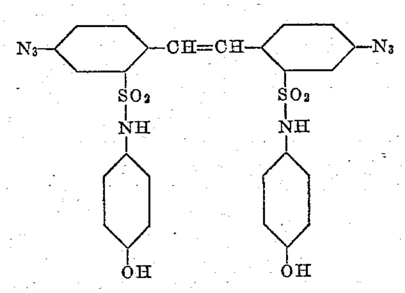

(7)

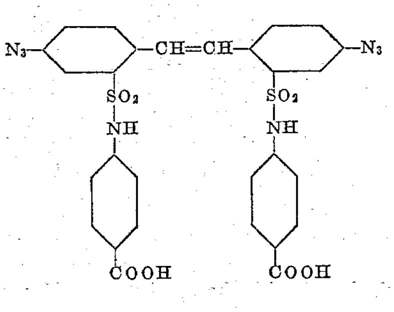

(8)

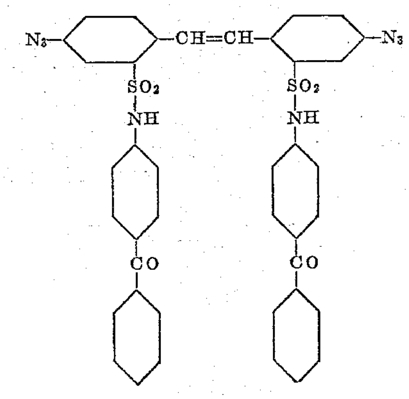

(9)
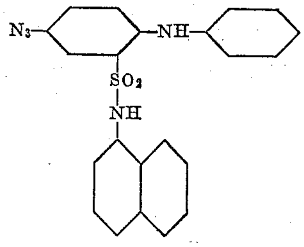
(10)
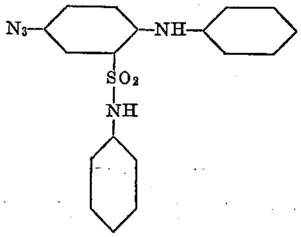
(11)
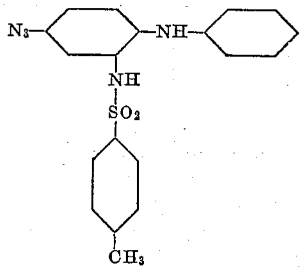
(12)
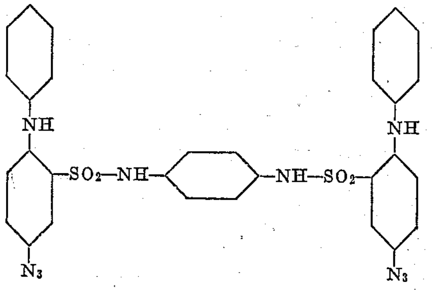
(13)
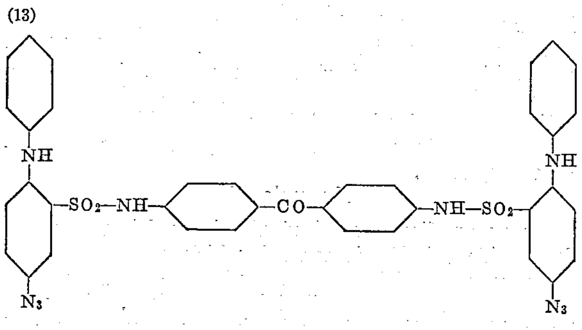
(14)
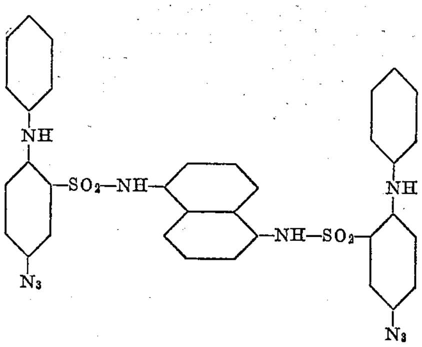
(15)
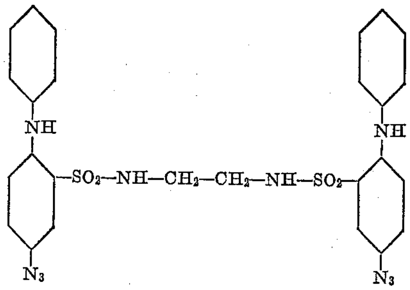
(16)
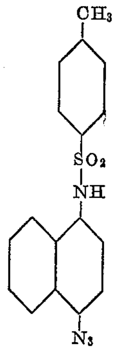
(17)
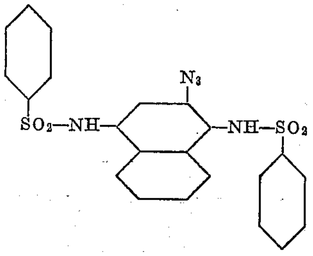
(18)
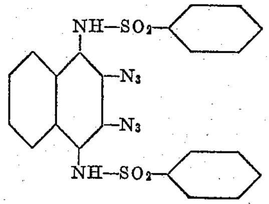
(19)
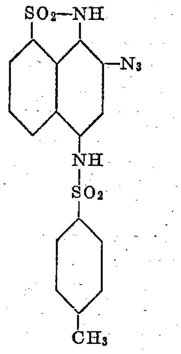
(20)
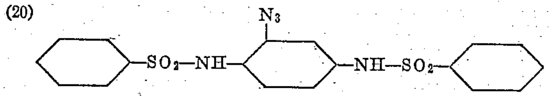
(21)
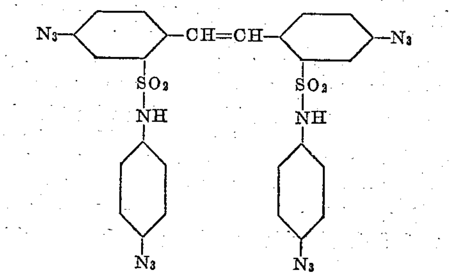

(22)
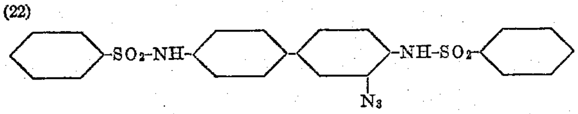

(23)
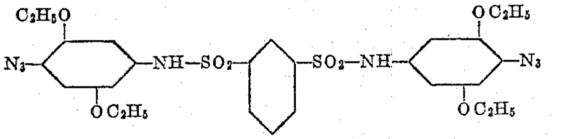

(24)
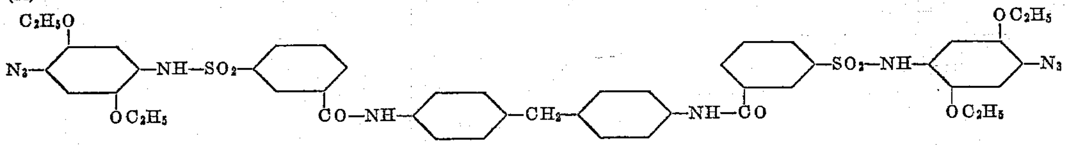

(25)
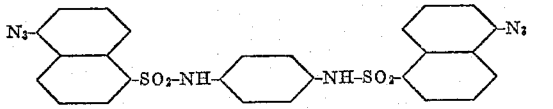

(26)
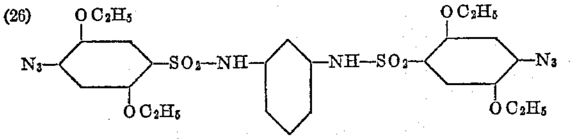

The following examples illustrate methods of carrying the invention into effect:

*Example I*

1 part by weight of the compound of Formula 1 and 0.2 part by weight of a non-hardenable, alkali-soluble phenol formaldehyde resin, e.g. a phenol formaldehyde novolak marketed by the firm of Chemische Werke Albert in Wiesbaden-Biebrich under the trade name "Alnovol," are dissolved in 20 parts by volume of dimethyl formamide and 80 parts by volume of glycol monomethyl ether. This solution is then coated in a plate whirler on an aluminum foil having a mechanically roughened surface. The light-sensitive layer thus applied to the foil is first dried by means of hot air and then further dried for 5 minutes at 90° in order to effect complete removal of the solvents. The layer is then exposed for 1 to 2 minutes under a transparent negative film master to a carbon arc lamp. The resultant exposure is developed to a positive image by swabbing with a 1–2% trisodium phosphate solution, and after briefly swabbing with 1% phosphoric acid is inked with greasy ink for the purpose of using the foil as a printing plate. The result is equally good if a compound of Formula 2 instead of the compound of Formula 1 is used.

The compound of Formula 1, 4,4-diazido-stilbene-2-2'-disulfonic acid anilide, is prepared by condensing 1 mol of 4,4'-dinitrostilbene-2,2'-disulfochloride with an excess of aniline (4 mols) in an inert solvent (dioxane or benzene) to obtain 4,4'-dinitrostilbene-2,2'-disulfonic acid anilide, which, after re-crystallizing from dimethyl formamide melts at 280–281°. The condensation product is dissolved in dimethyl formamide at room temperature and catalytically reduced using Raney nickel. By diazotization in aqueous hydrochloric acid dioxane solution with sodium nitrite at 0–5°, from the reduction product (M.P. 256–258°) there is obtained the corresponding 4,4'-bis-diazonium chloride, which melts at 120° with decomposition. If the latter is mixed in solution with 1½ times the equi-molecular quantity of sodium azide while cooling with ice, the diazido composed of Formula 1 is formed with an active splitting off of nitrogen and a rapid decolorization. After re-crystallization from dioxane it melts at 193–194° with swelling and decomposition. It is also obtained when 1 mol of 4,4'-diazido stilbene-2,2'-disulphochloride and 4 mols of aniline in dimethyl formamide solution are mixed, and the mixture is allowed to stand for several hours at room temperature. The diazido stilbene sulfochloride is produced by reaction of 4,4'-diazido stilbene disulfonic acid with phosphorus-pentachloride in phosphorus oxychloride at 80–90°.

In an analogous manner, the diazido compound of Formula 2 (melting point 202–204° with decomposition) is produced by reaction of 4,4'-dinitro stilbene-2,2'-disulfochloride with para-toluidine.

*Example II*

A zinc plate, roughened on its surface, is brushed for fiive minutes with 4% acetic acid, containing 4% potassium aluminum sulfate. The plate is washed with water, dried, and on the treated side is coated with a solution containing 2% of the compound of Formula 3 and 0.4% of the phenol formaldehyde resin mentioned in Example I in dimethyl formamide/glycol monomethyl ether (1:4). By exposing the dried layer under a negative transparent master a positive image is produced. The exposed side of the plate is linked with greasy ink. The plate is then developed with 2% trisodium phosphate solution and then briefly treated with a 5% solution of acid phosphate containing preferably mono-ammonium phosphate.

The compound of Formula 3 is produced by condensation of 4,4'-dinitro stilbene-2,2'-disulfochloride with 2-amino-1,4-dimethly benzene. The reduction of this compound as well as the diazotization and transposition with sodium azide occurs in the same way as is described in Example I. The diazido compound melts at 186–188° with decomposition.

*Example III*

In accordance with the procedure described in Example I, an aluminum foil is coated with a 1% solution of the compound of Formula 4 in dimethyl formamide/glycol monomethyl ether (1:3). The development of the exposed foil is carried out with 0.5% trisodium phosphate solution. From a negative master a positive image is obtained, which, after a brief treatment with acid and inking with greasy ink is ready for printing.

The compound of Formula 4 (M.P. 174–175° with decomposition) is obtained by the process described in Example I, where the condensation of 4,4'-dinitro stilbene-2,2'-disulfochloride is carried out with double the molecular quantity of para-amino phenolglycolether in the presence of pyridine.

*Example IV*

On an anodically oxidized aluminum foil a dimethyl formamide solution is applied, which contains 1% of the compound of Formula 5 and 0.5% of the phenol formaldehyde resin described in Example I. After the layer side is well dried, the foil is exposed normally and developed with a 2–3% trisodium phosphate solution. An image is obtained with reverse characteristics to the master used, and this can be used as a printing plate after brief treatment with 1% phosphoric acid and after inking with greasy ink.

The compound of Formula 6 can be used equally effectively. The compound of Formula 7 is equally suitable for the production of a printing plate, where a surface-roughened aluminum foil is used as the base material for the light-sensitive layer and a 1–2% disodium phosphate solution is used for the development of the image.

The compound of Formula 5, which melts at 195–196° with decomposition, is obtained by condensing dinitro stilbene sulfochloride with p-anisidine and proceeding in a manner similar to that described in Example I.

The compound of Formula 6 (M.P. 180° with slow decomposition and blackening) is similarly produced; condensation of 4,4'-dinitro stilbene-2,2'-disulfochloride being carried out with 2 mols para-amino phenol in the presence of pyridine. The compound of Formula 7 (M.P. is the same as the compound of Formula 6) is produced in the same way using 1 mol 4,4'-dinitro stilbene-2,2'-disulfochloride and 2 mols of para-amino benzoic acid as starting material and an excess of pyridene as the condensing agent.

*Example V*

1 part by weight of the compound of Formula 8 and 0.5 part by weight of colophony (Portuguese balsam resin) are dissolved in a mixture of 50 parts by volume of glycol monomethyl ether and 50 parts by volume of dimethyl formamide. An aluminum foil is coated with this solution as in Example I and exposed according to the directions given therein. The image, strongly colored brownish yellow, is wiped over with a 10% diethanol amine solution. The foil is then washed with water and wiped over with 1% phosphoric acid. When inked with greasy ink the foil becomes a positive printing plate, if a negative master was used.

The compound of Formula 8 (melting point 199–200° with decomposition) is obtained in a similar manner to that described in Example I using para-amino benzophenone (2 mols) instead of aniline in the first step of the reaction. Condensation is carried out in the presence of pyridine.

*Example VI*

An aluminum foil with a mechanically roughened surface is coated in the normal manner with a 1% solution of the compound of Formula 9 in dioxane. The dried foil is exposed under a transparent photographic negative and a positive image is obtained which is strongly colored brownish yellow after development with 2–10% trisodium phosphate solution. The image is briefly wiped over with 1% phosphoric acid and inked with greasy ink.

An equally good result is obtained using the compound of Formula 10 instead of the compound of Formula 9, where the image is suitably developed with a 0.5% solution of trisodium phosphate.

For the production of the compound of Formula 9, 1-chloro-4-nitrobenzene-2-sulfochloride is first condensed with α-naphthylamine in an inert solvent (benzene or dioxane) in the presence of pyridine, the 1-chloro-4-nitro-benzene-2-sulfonic acid-α-naphthylamide (M.P. 171–2°) obtained is heated with an excess of aniline for 30 minutes to a weakly boiling condition. The 4-nitro-1-phenylamino - benzene-2-sulfonic acid-α-naphthylamide (M.P. 168–9°) formed, is reduced with hydrogen and colloidal nickel, in alcoholic solution or in dioxane, under pressure to the corresponding amino-compound, melting at 95°, and is then diazotized with sodium nitrite in hydrochloric acid solution. By reaction with an aqueous sodium azide solution the diazonium chloride formed produces the azide of Formula 9.

In a similar way 4-azido-1-phenyl-aminobenzene-2-sulfonic acid-anilide of Formula 10 (M.P. 130–131° with spontaneous decomposition) is obtained. In this process condensation of 1-chloro-4-nitrobenzene-2-sulfonic acid-chloride with aniline is advantageously carried out using an excess of aniline.

*Example VII*

With a solution which contains 1 part by weight of the compound of Formula 11 and 0.5 part by weight of colophony dissolved in glycol monomethyl ether, an aluminum foil is coated and the layer dried with hot air. By exposing the light-sensitive layer under a negative transparent master, a greenish-yellow colored positive image is obtained, which is developed with a 2–5% triethanol amine solution. After being wiped over with 1% phosphoric acid and inked with greasy ink the plate is then ready for printing.

The compound of Formula 11 is obtained by first condensing 1-chloro-2,4-dinitrobenzene with an equi-molecular quantity of aniline in boiling alcohol, and partially reducing the 2,4-dinitro-1-phenylamino-benzene formed in an alcoholic solution, with sodium disulphide, to 4-nitro-2-amino-1-phenylamino-benzene. From this compound, by reaction with an equi-molecular quantity of para-toluene sulfochloride in an inert solvent (benzene or dioxane), in the presence of pyridine, 4-nitro-2-(para-toluene - sulfonylamino) - 1 - phenylamino - benzene (M.P. 174–176°) is produced. The latter is catalytically reduced in alcoholic solution with colloidal nickel and hydrogen under pressure. The 4-amino-2-(p-toluene-sulfonylamino)-1-phenylamino-benzene formed is diazotized with sodium nitrite in hydrochloric acid solution. From the diazonium chloride, by the action of an aqueous sodium azide solution, the azido compound of Formula 11 is produced. It melts at 117° with spontaneous decomposition.

*Example VIII*

On an aluminum foil having a roughened surface there is applied a glycol monomethyl ether solution, which contains 1% of the compound of Formula 12 and 0.2% of the unhardenable phenol-formaldehyde resin described in Example I. The light-sensitive layer so formed, and well dried at 90°, is exposed under a negative film master. The positive image obtained, strongly colored yellow-brown, is developed with a 1–2% solution of trisodium phosphate and then briefly wiped with 1% phosphoric acid and inked with greasy ink. The foil can be used as a printing plate.

The compounds of Formulae 13, 14 and 15 can be used equally well as light-sensitive substances. A mixture of glycol monomethyl ether and dimethyl formamide in the proportion of 3:1 by volume is preferably used to dissolve the compound of Formula 13. The compound of Formula 15 is applied to the aluminum foil without phenol formaldehyde resin and the image produced thereby is developed with an 0.5% caustic soda solution.

The compound of Formula 12 is produced by condensing 2 mols of 1-chloro-4-nitro-benzene-2-sulfochloride with 1 mol of para-phenylene diamine in the presence of pyridine in an inert solvent (dioxane or benzene). The condensation product is transformed to 1,4-bis-(4'-nitro-1'-phenylaminobenzene - 2'-sulfonylamino)-benzene by boiling with an excess of aniline, and the compound of Formula 12 is then formed from this product through reduction, subsequent diazotization and treatment with sodium azide in an aqueous solution. This melts at 164–165° with decomposition.

Analogously by the condensation of 2 mols of 1-chloro-4-nitrobenzene-2-sulfochloride with 1 mol of 4,4'-diamino-benzo-phenone the compound of Formula 13 (M.P. 168–170° with slow decomposition and blackening) is produced. From the condensation of 2 mols of 1-chloro-4-nitro-benzene-2-sulfochloride and 1 mol of 1,5-diamino-naphthalene the compound of Formula 14 is produced (M.P. 150–151° if recrystallized from dioxane-water; slow decomposition beginning at 170° if recrystallized from ether). From the condensation of 2 mols of 1-chloro-4-nitrobenzene-2-sulphochloride with an excess of ethylene diamine, the compound of Formula 15 (which melts at 75–78°) is recrystallized from ether.

*Example IX*

An aluminum foil is coated in the usual manner with a 1% solution of the compound of Formula 16, and containing 0.2% of the unhardenable phenol formaldehyde resin described in Example I. The layer is dried. After exposure of the layer under a positive transparent master, the negative image which is colored a weak brown, is swabbed with a 20% triethanol amine solution, washed with water and briefly wiped with 1% phosphoric acid. The foil can be used (after inking with greasy ink) as a printing plate in conventional printing machines.

The compound of Formula 16 is obtained by reacting para-toluene sulfochloride with 4-nitro-1-naphthylamine in an inert solvent (benzene, dioxane) in the presence of an excess of pyridine. The 4-nitro-1-(para-toluene sulfonyl-amino)-naphthalene formed is reduced with colloidal nickel and hydrogen. The reduction product is diazotized in hydrochloric acid solution and the diazonium chloride produced is converted with aqueous sodium azide solution into the azide, which melts at 120–121° with spontaneous decomposition.

*Example X*

An aluminum foil is coated with a solution of one part by weight of the compound of Formula 17 and 0.2 part by weight of the unhardenable phenol formaldehyde resin described in Example I, in 100 parts by volume of dimethyl formamide and dried at about 95°. After development of the image produced by exposure under a master in the normal way, the development being carried out with an 0.5% trisodium phosphate solution, and after a subsequent brief acid treatment, the image adhering to the light-affected parts of the foil is inked with greasy ink and the foil used as a printing plate for running copies.

The compound of Formula 17 is produced according to the instructions given by Roger Adams in the Journal of Amer. Chem. Soc. 74 (1952), p. 5561. The 1,4-bis-(benzenesulfonylamino)-naphthalene is oxidized with lead tetra-acetate in glacial acetic acid solution to 1,4-naphthoquinonedibenzenesulfonimide, and this is treated with sodium azide in glacial acetic acid, by which hydrazoic acid is formed. The azide melts at 185–186° with decomposition.

*Example XI*

A paper printing sheet, which is covered on one side with a layer consisting of casein and clay, hardened with formaldehyde, is treated on the coated side with a solution of 1 part by weight of the compound of Formula 18 in 100 cc. glycol monomethyl ether, and thoroughly dried. The sheet is exposed to an arc lamp under a negative transparent master and the brown-yellow positive image thus produced is developed with a 1% solution of diethanol amine, and then treated with a solution which contains ammonium phosphate, glycerine and phosphoric acid. The sheet is then inked with greasy ink for the purpose of being used as a printing plate.

The compound of Formula 18 (M.P. at 155–156° with decomposition) is obtained by oxidizing the compound of Formula 17 with lead tetra-acetate to 2-azido-1,4-naphthoquinone-di-(benzene-sulfonimide) and combining the di-imide with hydrazoic acid formed according to the procedure given by Adams (see Example X).

*Example XII*

An aluminum foil is coated with a solution containing 1% of the compound of Formula 19 and 0.2% of the unhardenable phenol formaldehyde resin described in Example I dissolved in glycol monomethyl ether, and dried. On exposing the layer under a negative film master, a strongly red colored positive image is obtained, which is developed with a 5–10% solution of disodium phosphate, wiped with 1% phosphoric acid and inked with greasy ink. The foil is ready for printing.

The compound of Formula 19 is obtained by condensing para-toluene sulfochloride with 4-amino-1,8-naphthosultam in an inert solvent (dioxane or benzene) in the presence of pyridine, and the so-formed 4-(para-toluene sulfonylamino)-1,8-naphthosultam (M.P. 228–229°) is oxidized with lead tetra acetate in glacial acetic acid to the corresponding di-imide with the formula

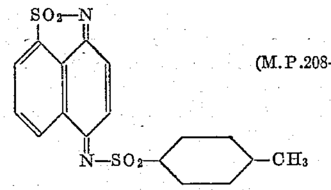

(M.P. 208-210°)

out of which the azido compound of Formula 19 is produced according to the procedure described by Adams (see Example X). The azido compound of formula 19 melts at 161° with decomposition.

*Example XIII*

An aluminum foil is coated in the normal way with a solution of glycol monomethyl ether, which contains 1% of the compound of Formula 20. The foil is dried, and a printing plate is produced by exposing the sensitized foil under a master, together with development of the resultant image with a 10–15% solution of disodium phosphate. The image on the printing plate is a negative image of the master used.

The compound of Formula 20 is produced (M.P. 163–165° with decomposition) by oxidizing 1,4-bis-(benzenesulfonylamino)-benzene to 1,4-benzoquinonedibenzenesulfonimide and combining the di-imide with hydrazoic acid according to the method described by Adams (see Example X).

*Example XIV*

An aluminum foil is coated in the normal way with a solution of 1 part by weight of the compound of formula 21 in 100 parts by volume of glycol monomethyl ether. The foil is dried, exposed under a master and developed using 20% solution of triethanol amine, in order to be available as a printing plate.

To produce the compound of formula 21, which is a tetra azide, 4,4′-dinitro-stilbene-2,2′-disulpho-chloride is condensed with 2 mols of para-nitro-aniline in boiling dioxane solution, in the presence of pyridine. The 4,4′-dinitro-stilbene-2,2′-bis-sulfonic acid-para-nitroanilide resulting is reduced in dimethyl formamide solution with colloidal nickel and hydrogen to 4,4′-diaminostilbene-2,2′-bis-sulfonic acid-para-amino-anilide. The latter is diazotized in hydrochloric acid solution and the tetra-diazonium chloride produced is transformed by reaction with an aqueous sodium azide solution to the compound of formula 21, which slowly chars at 150° under decomposition.

*Example XV*

An aluminum foil is coated in the normal manner with a 1% solution of the compound of Formula 22 in glycol monomethylether. The weakly visible image, obtained by about 3 minutes exposure to an arc lamp under a film master, is swabbed with a 0.3–0.5% solution of trisodium-phosphate and then treated with phosphoric acid. After inking the picture with greasy ink the foil is a printing plate, negative with relation to the master.

The compound of Formula 22, which melts at 178–179° with decomposition, is obtained from 4,4′-diphenoquinonedibenzenesulfonimide, which is reacted with sodium azide in glacial acetic acid, whereby hydrazoic acid is formed. 4,4′-diphenoquinonedibenzenesulfonimide is produced by oxidation of benzidinedibenzenesulfonamide according to Roger Adams and Richard Holmes, Journal of Amer. Chem. Soc. 74 (1952), p. 3035.

*Example XVI*

A surface roughened aluminum foil is coated with a solution of 1 part by weight of the compound of Formula 23 in a mixture of 50 parts by volume of glycol monomethyl ether and 50 parts by volume of dimethyl formamide. The layer is first briefly dried in warm air, and then further dried for five minutes at 90–100°. The layer is exposed under a transparent positive film original for about 3 minutes to an arc lamp, and by treatment with a 2–5% solution of trisodium phosphate, a positive image is developed which is grey in color on a shining metallic background. The image is then briefly wiped over with 1% phosphoric acid and inked with greasy ink. The foil is capable of long runs when used as an offset printing plate.

Equally good results are obtained by using a solution of the compound of Formula 24, in which development of the exposed layer is carried out with a 1% caustic soda solution. A positive printing plate is again obtained from a positive master.

The compound of Formula 23 is produced by condensing 2 mols of amino-hydroquinone diethyl ether with 1 mol of 1,3-benzenedisulphochloride in an inert solvent in the presence of pyridine, nitrating the resultant condensation product in glacial acetic acid with an equi-molecular quantity of nitric acid ($d$=1.52), and reducing the nitration product in dioxane solution with colloidal nickel and hydrogen under pressure. The reduction product is diazotized in hydrochloric acid solution with sodium nitrite and the bis-diazonium chloride formed is reacted with an aqueous solution of sodium azide, whereupon the diazide of Formula 23 separates out. It melts at 170–171° with decomposition.

The diazido compound of Formula 24 is obtained in the following way: benzoic acid-3-sulfochloride is condensed with amino-hydroquinone diethyl ether in benzene in the presence of pyridine (M.P. 169–170°). The condensation product is nitrated in glacial acetic acid with concentrated nitric acid; M.P. of the nitration product 197–198°. By reaction of the latter with phosphorus pentachloride, in phosphorus oxychloride as the solvent, the corresponding carboxylic acid chloride is formed (M.P. 155–156°). This is condensed with 4,4'-diamino-diphenyl-methane, in a molecular proportion of 2:1, in dioxane, in the presence of pyridine. This condensation product (M.P. 240–241°) is catalytically reduced in a mixture of dioxane and dimethyl formamide (in a proportion of 6:1 by volume) the amino compound formed (M.P. 157–158°) is diazotized in hydrochloric acid solution with sodium nitrite and the resultant bis-diazonium-chloride is transformed with sodium azide into the diazido compound of Formula 24 (which melts at 143–144° with decomposition).

*Example XVII*

A surface-roughened aluminum foil is coated in the usual way with a solution of 1 part by weight of the compound of Formula 25 in 100 parts by volume of a mixture of glycol-monomethyl-ether and dimethyl-foramide (1:1). The foil is dried, and then exposed under a positive film master. The image produced in the layer is then developed with a 0.5–1% solution of tri-sodium phosphate to a positive image, wiped with 1% phosphoric acid, and then inked with greasy ink. The foil is then ready to be used as a printing plate.

The compound of Formula 26 can equally successfully be used for the production of the light-sensitive layer. The development of the image then takes place with 1–2% trisodium phosphate solution.

The compound of Formula 25 is produced (M.P. 208–210° with decomposition) by condensing 2 mols of 5-nitro-1-naphthalene-sulfochloride with 1 mol of para-phenylene-diamine in dioxane in the presence of pyridine, reducing the reaction product in alkaline solution with sodium hydrosulphite at 80° and reacting the bis-diazonium chloride (produced in hydrochloric acid solution with sodium nitrite), with 2 mols of sodium azide in aqueous solution.

The compound of Formula 26 (M.P. 173° with decomposition, after recrystallization from dioxane-dimethyl formamide mixture) is produced in a similar way, i.e., 1 mol of metaphenylene-diamine is condensed with 2 mols of 4-nitro-2,5-diethoxy-benzene-1-sulfochloride. The condensation product is reduced. From the diamino compound (M.P. 175° after recrystallization from dioxane) the diazido compound (melting at 173°, with decomposition) is formed by diazotization, and reaction of the diazonium chloride with sodium azide.

What we claim is:

1. A compound having the formula

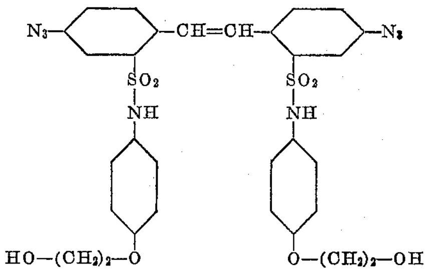

2. A process for the production of a presensitized printing plate which comprises coating a base material with a layer comprising a compound having the formula

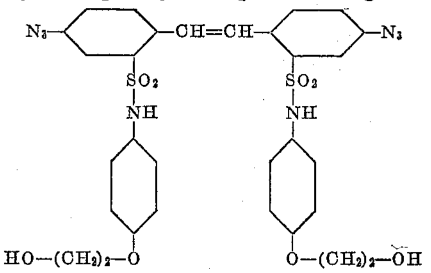

3. A process for the production of a printing plate which comprises coating a base material with a layer comprising a compound having the formula

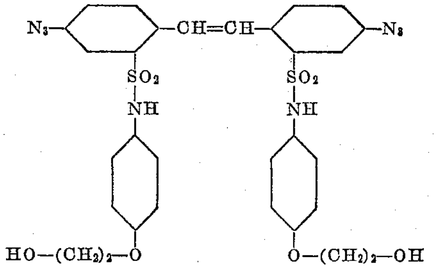

exposing the coated base to light under a master and treating the exposed base with a weakly alkaline solution.

4. A presensitized printing plate comprising a base material having a coating thereon of a compound having the formula

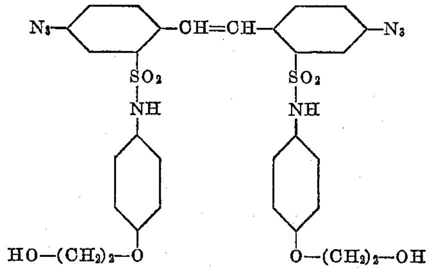

References Cited in the file of this patent

UNITED STATES PATENTS

| | | |
|---|---|---|
| 1,628,279 | Schmidt et al. | May 10, 1927 |
| 1,845,989 | Schmidt et al. | Feb. 16, 1932 |
| 2,254,191 | Roblin | Aug. 26, 1941 |
| 2,692,826 | Neugebauer et al. | Oct. 26, 1954 |

FOREIGN PATENTS

| | | |
|---|---|---|
| 886,716 | France | July 12, 1943 |
| 456,857 | Germany | Mar. 3, 1928 |